(12) United States Patent
Orman et al.

(10) Patent No.: US 10,670,657 B2
(45) Date of Patent: Jun. 2, 2020

(54) SYSTEM FOR MONITORING OPERATION STATUS OF ELECTRIC MACHINE AND MOBILE PHONE THEREFOR AND SERVER-BASED SYSTEM USING THE SAME

(71) Applicant: ABB Schweiz AG, Baden (CH)

(72) Inventors: Maciej Orman, Shanghai (CN); Pawel Rzeszucinski, Kedzierzyn-Kozle (PL); Karthik Krishnamoorthi, Tamil Nadu (IN)

(73) Assignee: ABB Schweiz AG, Baden (CH)

(*) Notice: Subject to any disclaimer, the term of this patent is extended or adjusted under 35 U.S.C. 154(b) by 16 days.

(21) Appl. No.: 15/453,411

(22) Filed: Mar. 8, 2017

(65) Prior Publication Data

US 2017/0176537 A1    Jun. 22, 2017

Related U.S. Application Data

(63) Continuation of application No. PCT/EP2015/054855, filed on Mar. 9, 2015.

(30) Foreign Application Priority Data

Sep. 9, 2014   (CN) .......................... 2014 1 0455702

(51) Int. Cl.
*G01R 31/34*   (2020.01)
*G01P 3/02*    (2006.01)
(Continued)

(52) U.S. Cl.
CPC .............. *G01R 31/343* (2013.01); *G01P 3/02* (2013.01); *G01R 33/02* (2013.01); *G08B 21/18* (2013.01); *H04W 88/02* (2013.01)

(58) Field of Classification Search
None
See application file for complete search history.

(56) References Cited

U.S. PATENT DOCUMENTS

| 4,893,086 A | 1/1990 | Shrewsbury |
| 6,041,287 A * | 3/2000 | Dister ................... B60L 3/0023 702/182 |

(Continued)

FOREIGN PATENT DOCUMENTS

| CN | 102836552 A | 12/2012 |
| CN | 103744021 A | 4/2014 |

(Continued)

OTHER PUBLICATIONS

Syaiful Bakhri, Investigation and Development of a Real-Time On-Site Condition Monitoring System for Induction Motors, Aug. 2008, 172 pages.*

(Continued)

*Primary Examiner* — Tung S Lau
(74) *Attorney, Agent, or Firm* — J. Bruce Schelkopf; Taft Stettinius & Hollister LLP

(57) ABSTRACT

A system configured for monitoring the operation status of an electric machine; a mobile phone therefor and server-based system using the same. The system includes a portable unit, adapted for free movement around the electric machine; an airborne acoustics sensor, adapted for measuring acoustic data produced by the electric machine at a first position in a path of the free movement; a magnetic field sensor, adapted for measuring magnetic field data produced by the electric machine at a second position in the path of the free movement; and a processing unit, adapted for calculating the operation status of the electric machine based on the acoustic data from the airborne acoustics sensor and the magnetic field data from the magnetic field sensor; wherein: the airborne acoustics sensor and the magnetic field sensor are integrated with the portable unit.

19 Claims, 13 Drawing Sheets

Electric machine

(51) Int. Cl.
*G01R 33/02* (2006.01)
*G08B 21/18* (2006.01)
*H04W 88/02* (2009.01)

(56) References Cited

U.S. PATENT DOCUMENTS

| | | | | |
|---|---|---|---|---|
| 6,262,550 | B1* | 7/2001 | Kliman | G05B 23/0264 |
| | | | | 318/565 |
| 8,396,280 | B2 | 3/2013 | Amidi | |
| 2004/0024499 | A1* | 2/2004 | Altieri | B64C 29/005 |
| | | | | 701/3 |
| 2005/0264283 | A1* | 12/2005 | Parenti | G01D 5/145 |
| | | | | 324/207.25 |
| 2009/0015196 | A1* | 1/2009 | Baxter | H02J 5/005 |
| | | | | 320/108 |
| 2009/0055129 | A1* | 2/2009 | Altieri | B64C 29/005 |
| | | | | 702/182 |
| 2009/0265138 | A1* | 10/2009 | Liu | H04M 19/04 |
| | | | | 702/183 |
| 2011/0231146 | A1 | 9/2011 | Hsio et al. | |
| 2013/0184838 | A1* | 7/2013 | Tchoryk, Jr. | G05B 13/042 |
| | | | | 700/31 |
| 2017/0173262 | A1* | 6/2017 | Veltz | A61M 5/1723 |

FOREIGN PATENT DOCUMENTS

| | | |
|---|---|---|
| DE | 3722805 A1 | 1/1989 |
| JP | 2010071866 A | 4/2010 |

OTHER PUBLICATIONS

H.R. Everett, Sensors for Mobile Robots, Theory and Application, 543 pages, 1995.*
European Patent Office, International Search & Written Opinion issued in corresponding Application No. PCT/EP2015/054855, dated Aug. 11, 2015, 10 pp.
Ceban et al., "Study of Rotor Faults in Induction Motors Using External Magnetic Field Analysis," IEEE Transactions on Industrial Electronics, vol. 50, No. 5, May 2012, pp. 2082-2093.
Kokko, Voitto, "Condition Monitoring of Squirrel-Cage Motors by Axial Magnetic Flux Measurements," Academic Dissertation, University of Oulu, Finland, 157 pp.
Chinese Search Report, China Patent Application No. 2014104557029, dated Nov. 26, 2018, 4 pages including English Translation.
China First Office Action, China Patent Application No. 2014104557029, dated Nov. 26, 2018, 15 pages including English Translation.

* cited by examiner

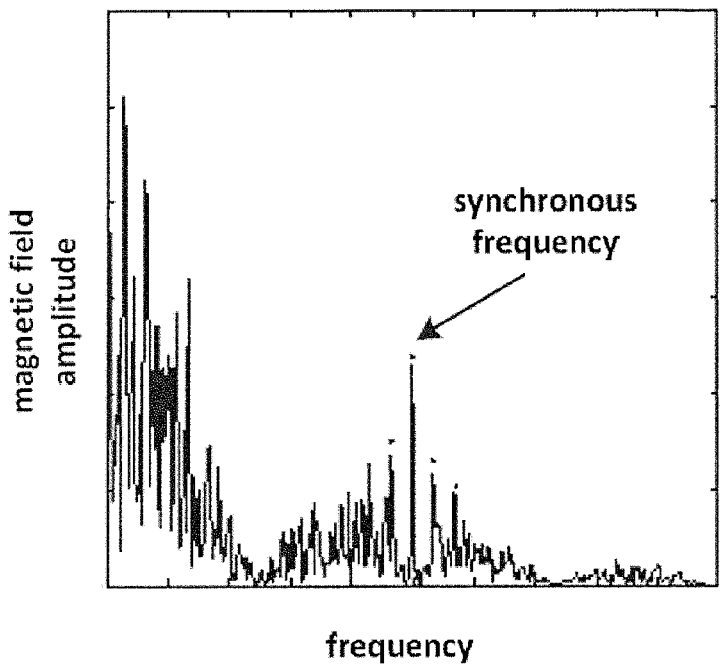

Figure 3D

| Step 40, the operator can carry the monitoring system 1 to a first position in proximity of the electric machine |
|---|

↓

| Step 41, the processing unit 13 receives the acoustic data from the airborne acoustics sensor 11 |
|---|

↓

| Step 42, the operator can carry the monitoring system 1 to a second position in proximity of the electric machine |
|---|

↓

| Step 43, the processing unit 13 receives the magnetic field data from the magnetic field sensor 12 |
|---|

↓

| Step 44, the processing unit 13 calculates condition of the electric machine as the operation status of the electric machine based on the acoustic data from the airborne acoustics sensor 11 and the magnetic field data from the magnetic field sensor 12 |
|---|

Figure 4A

SYSTEM FOR MONITORING OPERATION STATUS OF ELECTRIC MACHINE AND MOBILE PHONE THEREFOR AND SERVER-BASED SYSTEM USING THE SAME

TECHNICAL FIELD

The invention relates to the field of system for electric machine diagnosis, and more particularly to a system for monitoring operation status of an electric machine, a server-based system for monitoring operation status of an electric machine including the system for monitoring operation status of the electric machine, and a mobile phone including the system for monitoring operation status of an electric machine.

BACKGROUND ART

In many instances, electric machines such as for example electric motor, electric generator, and the like, are monitored by various monitoring systems for operation status including slip, fault with electric machine component and the like. Generally, the monitoring systems that monitor these electric machines are comprised of one or more transducers that are proximate to and associated with the electric machine. The monitoring systems can also include components for signal processing, alarming and display, which may be combined into one device or located in separate components.

U.S. Pat. No. 8,396,280 discloses a portable asset inspection device can be used during the inspection of one or more assets, such as assets in a processing or other environment. A camera in the portable asset inspection device can be used to take digital photographs of assets being inspected. A sound recorder in the portable asset inspection device can be used to record oral notes of a user or other sounds associated with the inspection of the assets. The collected data can be transmitted in either real-time or non-real-time to an external system. Thus, only visual data and acoustic data are collected by the portable asset inspection device. When applying this kind of portable asset inspection device into the area of operation status monitoring of an electric machine, the accuracy would be relatively low.

BRIEF SUMMARY OF THE INVENTION

It is therefore an objective of the invention to at least partially reduce or solve the problems in the prior art.

The present invention provides a system for monitoring operation status of an electric machine, including: a portable unit, being adapted for free movement around the electric machine; an airborne acoustics sensor, being adapted for measuring acoustic data produced by the electric machine at a first position in a path of the free movement; a magnetic field sensor, being adapted for measuring magnetic field data produced by the electric machine at a second position in the path of the free movement; and a processing unit, being adapted for calculating the operation status of the electric machine based on the acoustic data from the airborne acoustics sensor and the magnetic field data from the magnetic field sensor; wherein: the airborne acoustics sensor and the magnetic field sensor are integrated with the portable unit. By integration of the processing unit in the portable unit and thus they can move along with each other, it makes the monitoring system more compact and the selection of the measuring positions more flexible.

According to another aspect of the invention, it provides a mobile phone having the system for monitoring operation status of an electric machine. The reuse of a mobile phone to provide diagnostic information constitutes a powerful and extremely accessible tool for service technicians and it is easy to imagine many different business benefits by selling service not hardware.

According to another aspect of the invention, it provides server-based system for monitoring operation status of an electric machine, including: the system for monitoring operation status of an electric machine, an identification marker reader integrated in the portable unit of the system for monitoring operation status of an electric machine, being adapted for receiving or reading signal representing identification information concerning the electric machine from an identification marker tag on the electric machine; a server, being adapted for synchronizing historical data associated with the identification information concerning the electric machine with the system for monitoring operation status of the electric machine; wherein: the processing unit of the system for monitoring operation status of the electric machine according to the embodiments as described herein is further adapted for selecting optimal type of calculation of the operation status of the electric machine based on electric machine parameters and historical data associated with the identification information concerning the electric machine. In this system all the measurements of electric motors are performed (exploiting high number of embedded sensors) while the processing of the data is done remotely on the server. Such a scheme assures that the algorithms for data processing are not visible (easy to copy) by any 3rd party. Additionally this scheme requires uploading of raw (or partially processed) data to the server which is critical for building data base with motor related information. Based on such a data base, it will be possible to perform lifetime prediction or any other statistical analysis.

The disclosure is also directed to an apparatus for carrying out the disclosed methods and including apparatus parts for performing each described method steps. These method steps may be performed by way of hardware components, a computer programmed by appropriate software, by any combination of the two or in any other manner. Furthermore, the disclosure is also directed to methods by which the described apparatus operates. It includes method steps for carrying out every function of the apparatus.

Embodiments, further aspects, details and advantages are furthermore evident from the dependent claims, the description, and the drawings.

BRIEF DESCRIPTION OF THE DRAWINGS

The subject matter of the invention will be explained in more detail in the following text with reference to preferred exemplary embodiments which are illustrated in the drawings, in which:

FIG. 3D illustrates a magnetic field spectrum of electric machine with dominant synchronous frequency;

FIGS. 4A and 4B are flowcharts illustrating a method of practicing an embodiment of present invention for electric machine fault detection;

The reference symbols used in the drawings, and their meanings, are listed in summary form in the list of reference symbols. In principle, identical parts are provided with the same reference symbols in the figures.

PREFERRED EMBODIMENTS Of The INVENTION

Figure 1:
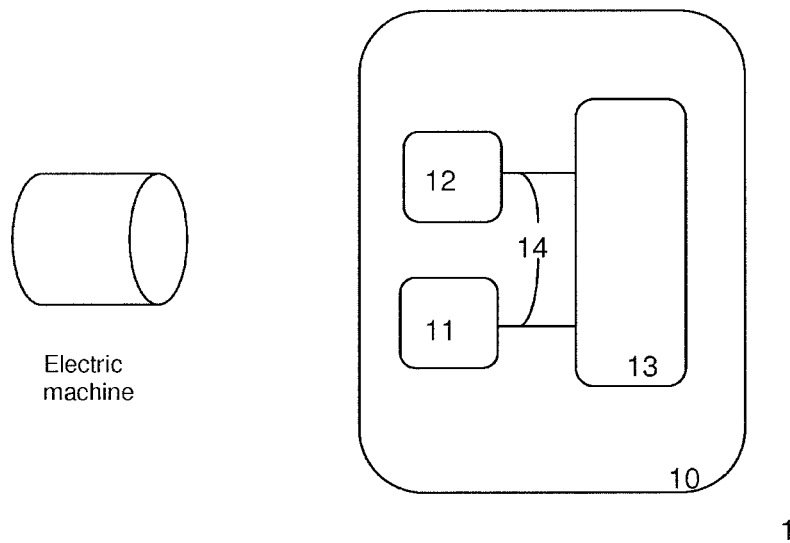
FIG. 1 is a block diagram for a system for monitoring operation status of an electric machine according to an embodiment of present invention.

FIG. 1 is a block diagram for a system for monitoring operation status of an electric machine according to an embodiment of present invention. As shown in FIG. 1, the system 1 includes a portable unit 10, an airborne acoustics sensor 11, a magnetic field sensor 12 and a processing unit 13, wherein the airborne acoustics sensor 11 and the magnetic field sensor 12 are integrated with the portable unit 10. For example, the portable unit 10, together with the airborne acoustics sensor 11 and the magnetic field sensor 12 integrated therewith can be held and carried by an operator and moved freely around the electric machine, for example to various positions in the movement path that are convenient for the operator, such as the position proximate to the shaft of the electric machine, the position proximate to the stator of the electric machine and the like. In a plant where the electric machine is located, there may be other machines situated at various positions with respect to the electric machine. In some case, the machines may be located close to the shaft of the electric machine so that no mounting space is available for fitting the monitoring system there; in another case, the machines may be located close to the stator of the electric machine so that no mounting space is available for fitting the monitoring system there. In addressing the various scenarios, by having the sensors integrated with a portable unit, the operator is able to flexibly put the monitoring system at a place where no obstacle stays in the way. This is helpful for carrying out the monitoring process in a flexible manner adapting to various arrangement of machines in a plant.

The airborne acoustics sensor 11 is an acoustic-to-electric transducer, for example microphone. As integrated with the portable unit 10, it can measure the acoustic data produced by the electric machine at a first position in the path of the movement. For example, the operator can carry the portable unit 10 to a place proximate to the shaft or the stator of the electric machine so long as no obstacle stays in the way to the position. The airborne acoustics sensor 11 is selected such that it provides an output in accordance with the sound pressure emitted by the electric machine, which reflects operation status-related characteristic of the electric machine. For example, the airborne acoustics sensor 11 can be a microphone that transforms energy from the sound wave emitted by the electric machine. The output or output signal produced by the airborne acoustics sensor 11 can be for example a voltage output, a current output by the airborne acoustics sensor 11 of any measurement thereof. The magnetic field sensor 12 is a magnetic-to-electric transducer, for example magnetometer. As integrated with the portable unit 10, it can measure the magnetic data produced by the electric machine at a second position in the path of the movement. For example, the operator can carry the portable unit 10 to a place proximate to the shaft or the stator of the electric machine so long as no obstacle stays in the way to the position. The magnetic field sensor 12 is selected such that it provides an output in accordance with the magnetic field density created by the electric machine, which reflects operation status-related characteristic of the electric machine. For example, the magnetic field sensor 12 can be a magnetometer that transforms energy from the magnetic field created by the electric machine. The output or output signal transformed by the magnetic field sensor 12 can be for example a voltage output, a current output by the magnetic field sensor 12 of any measurement thereof. The skilled person shall understand that the first position in the path of the free movement is same as the second position in the path of the free movement, or they can be different from each other. For example, both of the first position and the second position are located at the same place close to the shaft/stator of the electric machine, and thus the acoustic measurement and the magnetic measurement are taken at the same place and in a simultaneous manner. While making simultaneous measurements at one place different signal types can be analyzed together. For example speed can be estimated based on acoustic signal and line frequency based on magnetic signal. If measurements are not taken simultaneously speed from acoustic might not correspond to line frequency from magnetic field. Alternatively, the first position is situated close to the shaft of the electric machine while the second position is situated close to the stator of the electric machine.

The processing unit 13 can calculate the operation status of the electric machine based on the acoustic data from the airborne acoustics sensor 11 and the magnetic field data from the magnetic field sensor 12 as described in more detail hereafter. The operation status of an electric machine, for example, includes slip, fault with electric machine component and the like. Generally, the acoustic data and the magnetic field data are provided to the processing unit 13 through a communication line 14. In various instances, the communication line 14 can be wired, wireless or a combination of wired and wireless. In one aspect, the processing unit 13 is a part of a computer; as an alternative, the processing unit 13 can be integrated in the portable unit 10. By integration of the processing unit 13 in the portable unit 10 and thus they can move along with each other, it makes the monitoring system 1 more compact and the selection of the measuring positions more flexible.

Figure 2A:
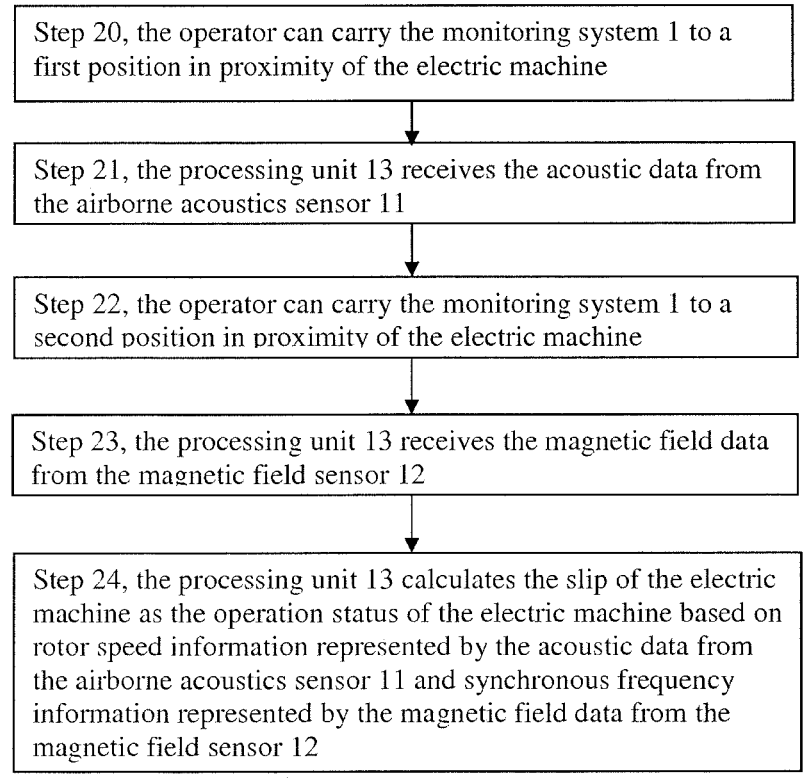
FIGS. 2A and 2B are flowcharts illustrating a method of practicing an embodiment of present invention for electric machine slip estimation.
Figure 2B:
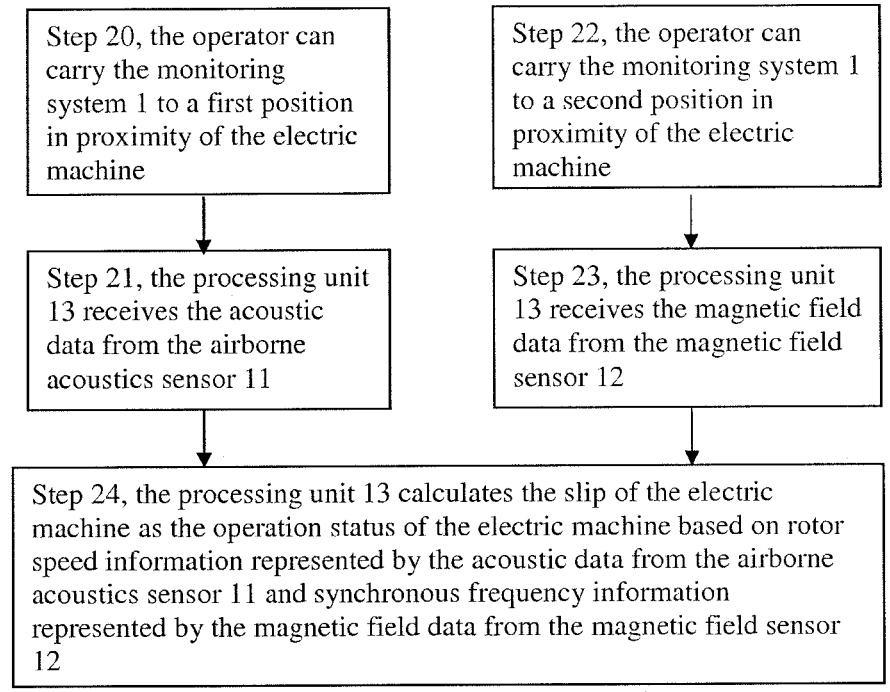

FIGS. 2A and 2B are flowcharts illustrating a method of practicing an embodiment of present invention for electric machine slip estimation.

At step 20, the operator can carry the monitoring system 1 to a first position in proximity of the electric machine. For example, the first position can be close to the shaft/stator of the electric machine where no other machine has occupied.

At step 21, the processing unit 13 receives the acoustic data from the airborne acoustics sensor 11, wherein the acoustic data is an indication for the rotor speed information of the electric machine. The acoustic data of the airborne acoustics sensor 11 are created by the electric machine. For example, the airborne acoustics sensor 11 can transform the acoustic data from acoustic signal emitted by the electric machine, for example the rotating rotor of the electric machine, which is dominant character in the acoustic signal spectrum.

At step 22, the operator can carry the monitoring system 1 to a second position in proximity of the electric machine. For example, the second position can be close to the shaft/stator of the electric machine where no other machine has occupied.

At step 23, the processing unit 13 receives the magnetic field data from the magnetic field sensor 12, wherein the magnetic field data is an indication for the synchronous frequency of the electric machine. The magnetic field data of the magnetic field sensor 12 are created by the electric machine. For example, the magnetic field sensor 12 can transform the magnetic field data from the magnetic flux leakage of the operating electric machine which is measurable around the housing of the electric machine. The skilled person shall understand that the first position in the path of the free movement is same as the second position in the path of the free movement, or they can be different from each other; consequently, the acoustic measurement and the magnetic measurement can be taken sequentially (acoustic measurement precedes magnetic measurement or vice versa) or simultaneously.

Figure 3A:
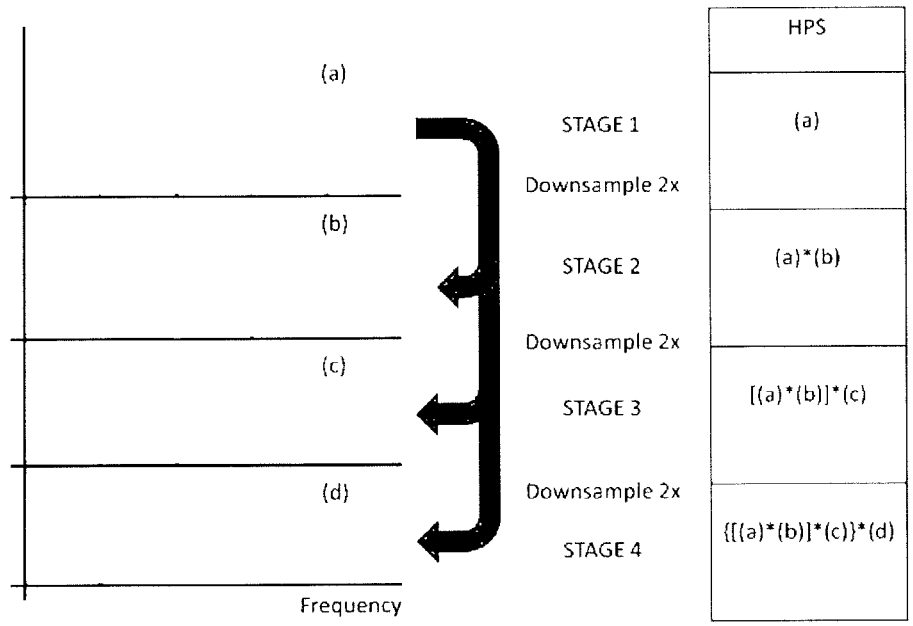
FIG. 3A illustrates the principle of the HPS algorithm.
Figure 3B:
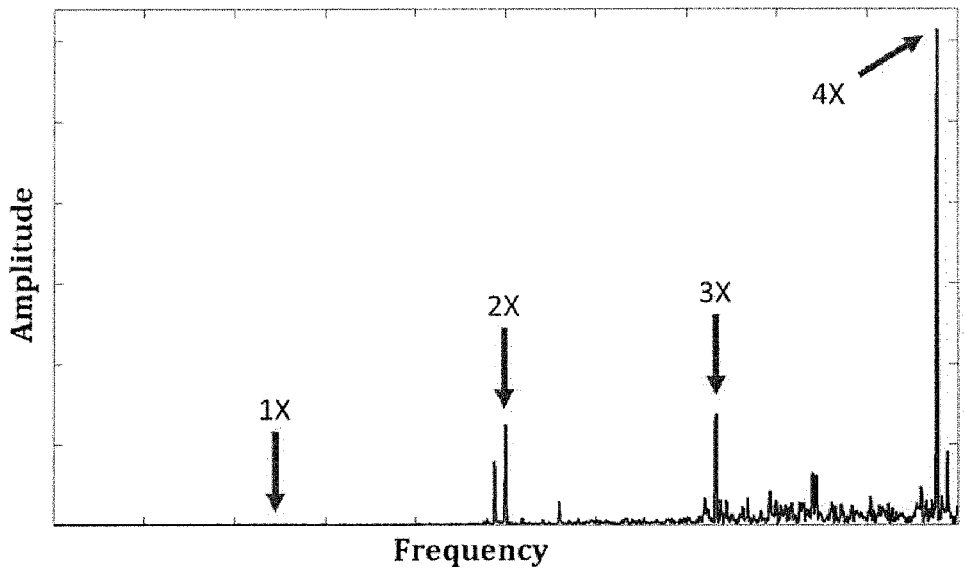
FIG. 3B shows the acoustic data spectrum measured by the monitoring system.
Figure 3C:
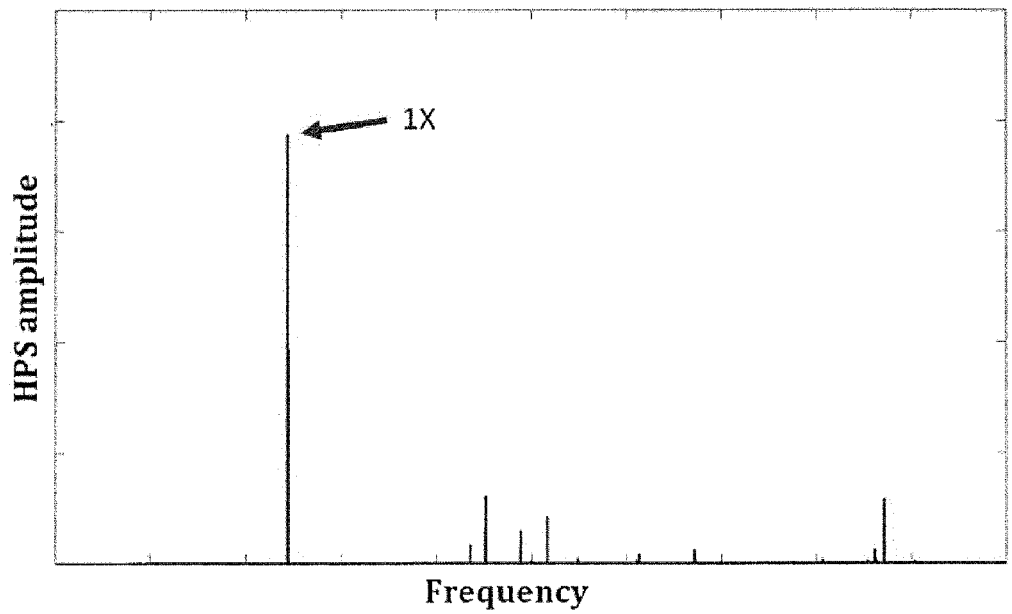
FIG. 3C illustrates the outcome of the acoustic data spectrum after the HPS.

At step 24, the processing unit 13 calculates the slip of the electric machine as the operation status of the electric machine based on rotor speed information represented by the acoustic data from the airborne acoustics sensor 11 and synchronous frequency information represented by the magnetic field data from the magnetic field sensor 12. For example, the processing unit 13 considers fundamental frequency of the acoustic data indicating the rotor speed information. As stated above, it is relatively easy to obtain the actual rotor speed from acoustic data due to its dominant character in the acoustic signal spectrum (lots of harmonics). In this example, algorithm of the speed estimation is heavily based on the Harmonic Product Spectrum (UPS) routine, originating from the field of sound pitch detection. FIG. 3A illustrates the principle of the HPS algorithm. FIG. 3B shows the acoustic data spectrum measured by the monitoring system. As shown in FIGS. 3A and 3B, the original acoustic data containing for example 4 harmonics of the fundamental frequency is downsampled the number of times that corresponds to the degree of the expected harmonic content. After the first downsampling of the signal, its original version is multiplied by the downsampled version. The second step involves multiplying the product of the preceding step with the currently downsampled signal. This procedure continues for a pre-defined number of times. In the end, the strongest component of the signal lying in the proximity of the nominal rotor speed will be the fundamental harmonic of the series, which in this case will be corresponding to the rotor speed. FIG. 3C illustrates the outcome of the acoustic data spectrum after the HPS. As shown in FIG. 3C, after performing a 4-stage HPS i.e. downsampling and multiplying the signal 4 times. As it is clearly visible, the fundamental frequency of the rotor speed, which was virtually invisible in the raw spectrum, becomes dominant is dominant in presented range therefore easily to be picked up. The processing unit 13 is takes a frequency of the strongest harmonic peak within a predetermined range of nominal synchronous frequency as the synchronous frequency information. FIG. 3D illustrates a magnetic field spectrum of electric machine with dominant synchronous frequency. It is known that even in the case of a healthy electric machine there is always some degree of magnetic flux leakage which is measurable around the electric machine housing. For example, in case of induction motors, the frequency which is always present in the magnetic field around motor is referred to as the synchronous frequency. This component is defined as the line frequency divided by the number of motor pole pairs. Typically the number of motor pole pairs is a known parameter and is always present in the motor nameplate details. As shown in FIG. 3D presenting the magnetic field spectrum of the two pole pair electric machine supplied by approximately 50 Hz with two pole pairs each, this translates to the synchronous frequency oscillating around 25 Hz. As it is clearly visible, this frequency stands out in the spectrum and so it is easy to detect it in the known range of nominal synchronous frequency. The estimated quantities are used to derive the actual value of the rotor slip, which is calculated as per the formula (1) below:

$$S=(f_s-f_r)/f_s \tag{1}$$

Where $f_s$ is the estimated synchronous frequency of the electric machine,

S is the slip of the electric machine, $f_r$ is the estimated rotational speed of the electric machine.

By having the monitoring system according to the embodiment of present invention, it allows the operator to flexibly select the convenient position with respect to the electric machine to do the acoustic and magnetic measurement for slip estimation. In addition, the estimation accuracy can be improved by doing both of the acoustic and magnetic measurements with the integration airborne acoustics sensor and magnetic field sensor with the portable unit, in particular simultaneously.

Figure 4B:
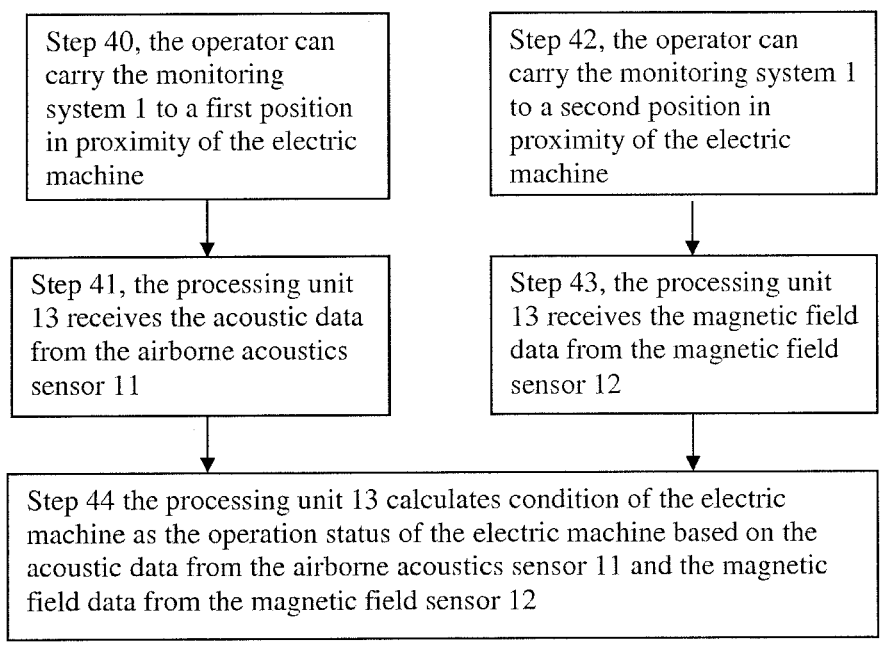

FIGS. 4A and 4B are flowcharts illustrating a method of practicing an embodiment of present invention for electric machine fault detection.

At step 40, the operator can carry the monitoring system 1 to a first position in proximity of the electric machine. For example, the first position can be close to the shaft/stator of the electric machine where no other machine has occupied.

Figure 5A:
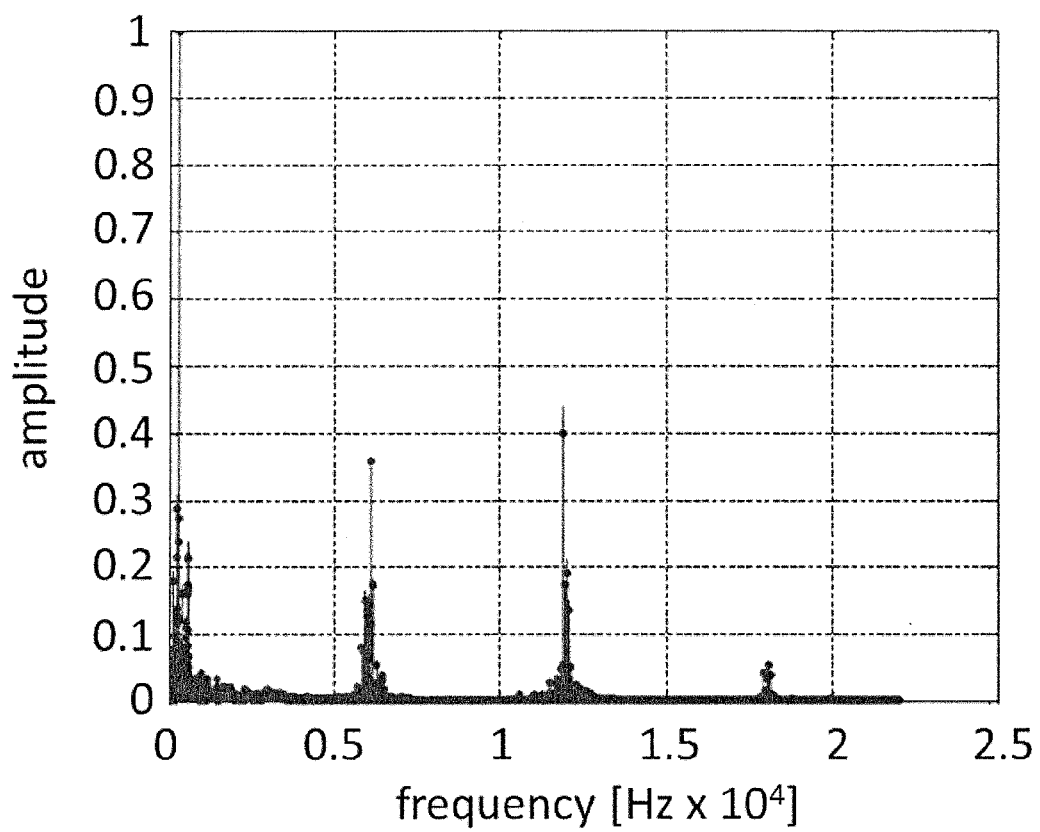
FIGS. 5A and 5B respectively present the acoustic spectrum of a healthy electric machine case and a faulty electric machine with a broken bar.
Figure 5B:
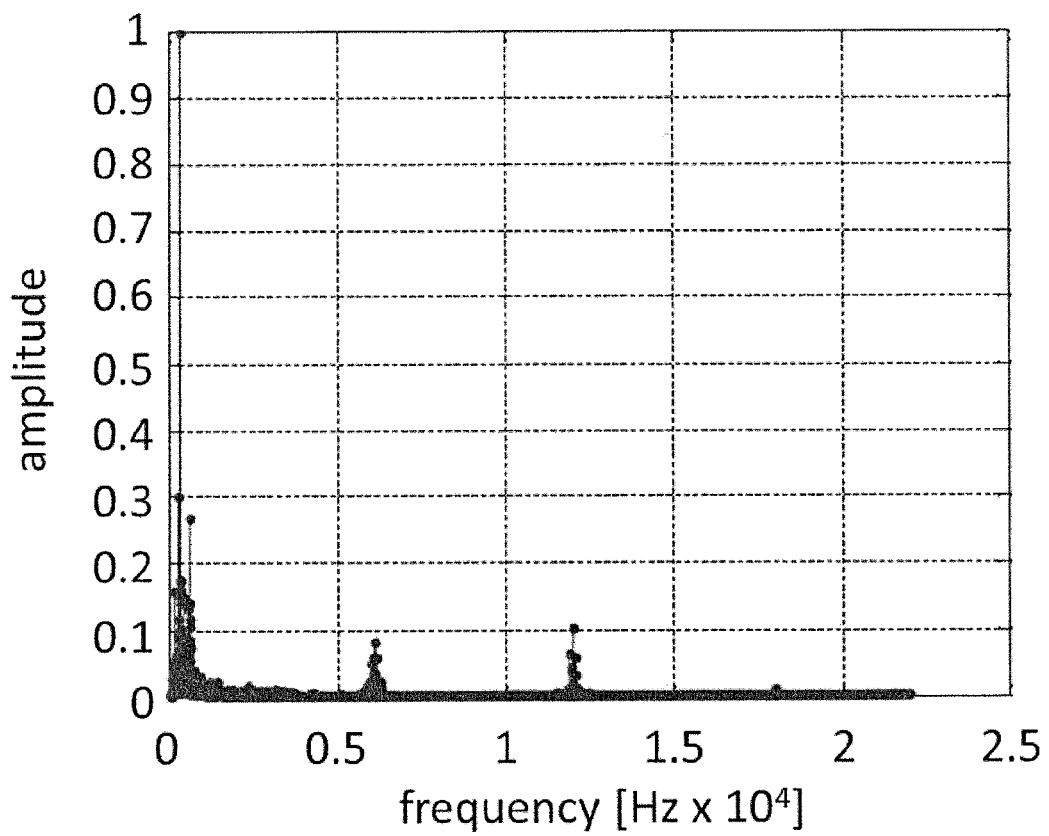
Figure 5C:
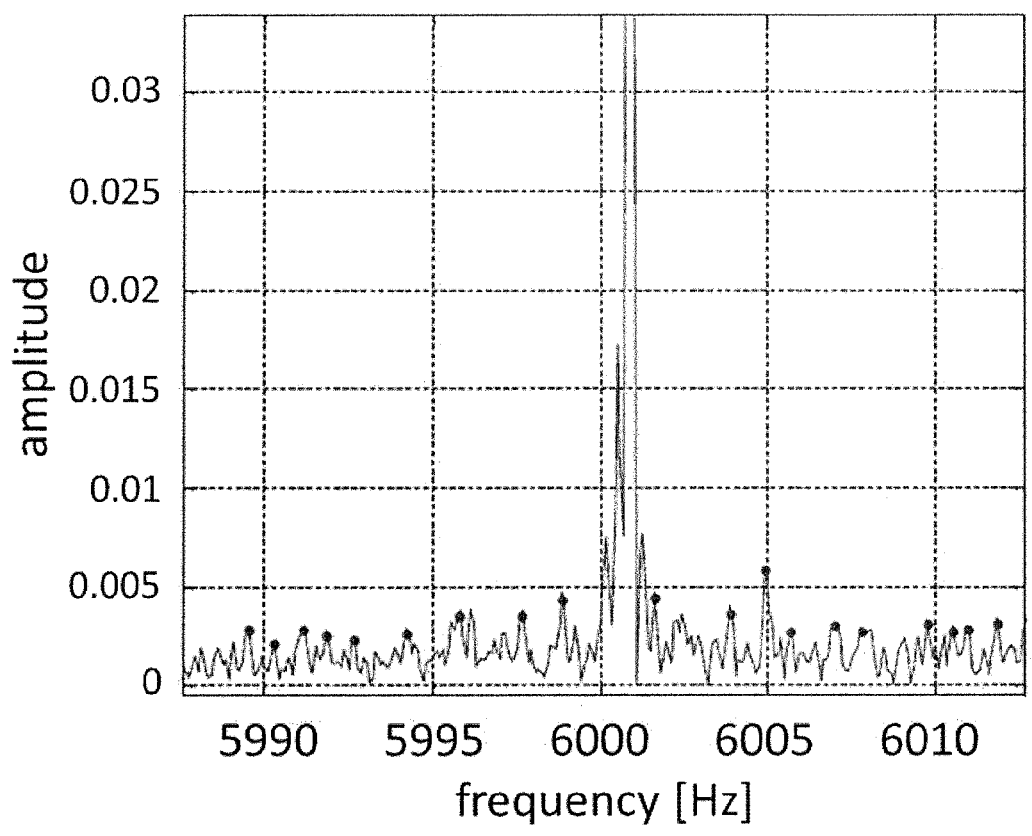
FIGS. 5C and 5D respectively present magnified views of FIGS. 5A and 5B concerning spectra in the higher order frequency harmonics of the electric machine rotational speed.
Figure 5D:
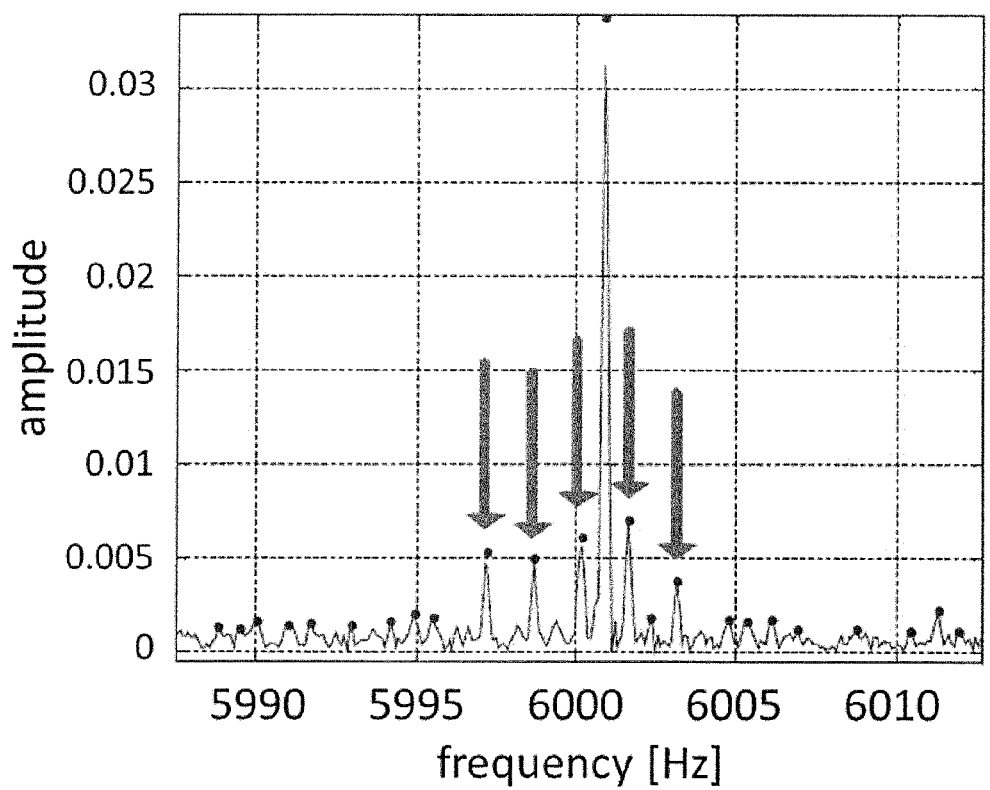

At step 41, the processing unit 13 receives the acoustic data from the airborne acoustics sensor 11, wherein the acoustic data is an indication for the condition of the electric machine. The acoustic data of the airborne acoustics sensor 11 are created by the electric machine. For example, the airborne acoustics sensor 11 can transform the acoustic data from acoustic signal emitted by the electric machine, for example the rotating rotor of the electric machine. In case of broken rotor bar for example, the damage is known to cause the appearance of certain sidebands that can be observed around harmonics of rotational speed in the spectrum of vibration/acoustic signal. FIGS. 5A and 5B respectively present the acoustic spectrum of a healthy electric machine case and a faulty electric machine with a broken bar. The amplitude of sound is normalized to [pu]. It can be seen there is a clearly visible difference between the amplitude distribution for the lower and the higher frequencies for the healthy and the faulty case. In order to detect the presence of the broken rotor bar it is important to analyse the sidebands around the harmonics of the rotation speed. FIGS. 5C and 5D respectively present magnified views of FIGS.

5A and 5B concerning spectra in the higher order frequency harmonics of the electric machine rotational speed. One can see that in the healthy case the harmonics of the rotational speed do not have any clearly visible sidebands. On the contrary in the case of the broken rotor bar the spectrum contains some clearly visible sidebands around the rotational speed harmonics. These sidebands are spaced at twice the slip (marked by arrows). The appearance of these sidebands is an indication of a broken rotor bar. Therefore, if there exit such sidebands, this can be an indication that the electric machine has a fault on its rotor.

At step 42, the operator can carry the monitoring system 1 to a second position in proximity of the electric machine. For example, the second position can be close to the shaft/stator of the electric machine where no other machine has occupied.

At step 43, the processing unit 13 receives the magnetic field data from the magnetic field sensor 12, wherein the magnetic field data is an indication for the condition of the electric machine. The magnetic field data of the magnetic field sensor 12 are created by the electric machine. For example, the magnetic field sensor 12 can transform the magnetic field data from the magnetic flux leakage of the operating electric machine which is measurable around the housing of the electric machine. The presence of a broken rotor bar or damaged end ring, causes an unbalance in the rotor magnetic flux, as the current cannot flow through the broken or cracked bar/end-ring. The unbalanced rotor flux can be considered as a combination of positive and negative sequence rotor flux, rotating at a slip frequency in the opposite directions. It is known that the presence of broken rotor bar causes the appearance of additional frequency components in the axial magnetic field of the electric machine, and the additional frequency components can be taken as an indicator for a faulty condition of the electric machine. The low frequency component related with the broken rotor bar is given by the following formula (2):

$$f_{bb}=k*s*f_s \qquad (2)$$

where:

$f_{bb}$ is broken rotor bar related frequency $f_s$ is the supply frequency of the electric machine s is the slip of the electric machine k=1, 3, 5 . . . .

Figure 6A:
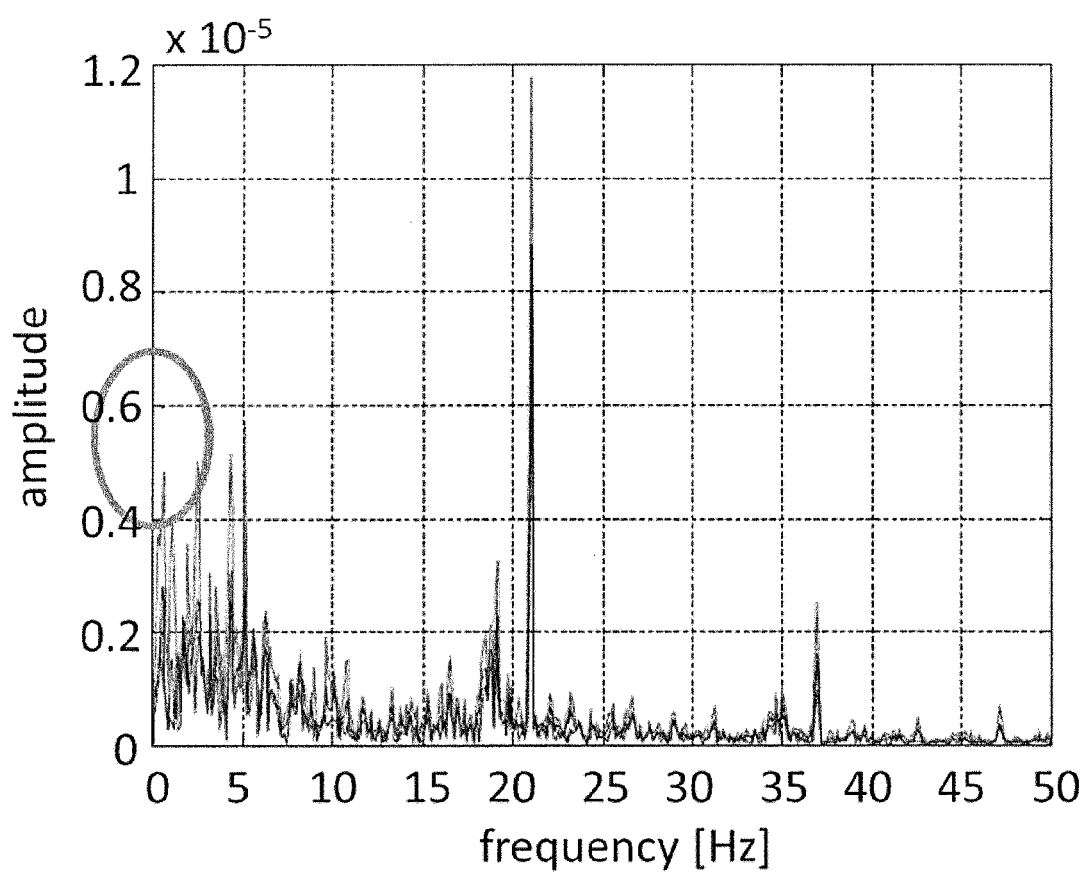
FIGS. 6A and 6B respectively illustrate spectra of magnetic field data of the axial magnetic field spectra of a healthy electric machine and a faulty electric machine with a broken rotor bar.
Figure 6B:
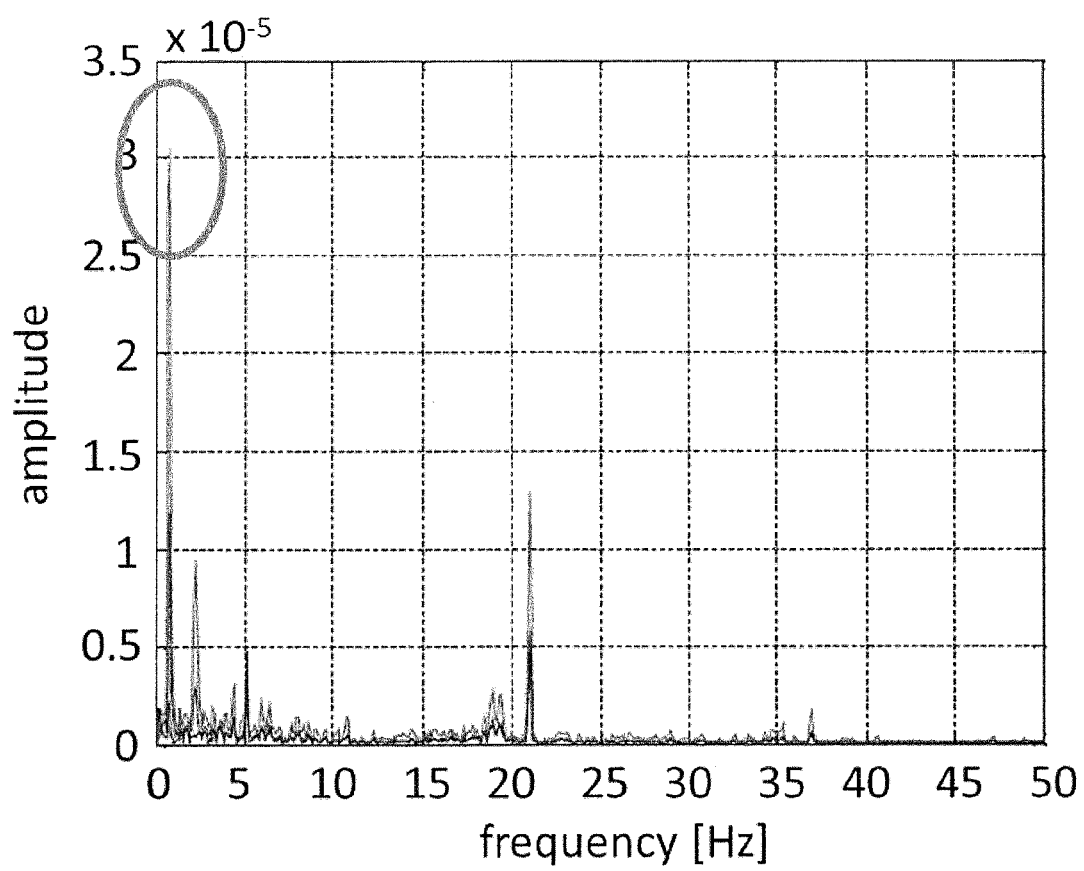
Figure 6C:
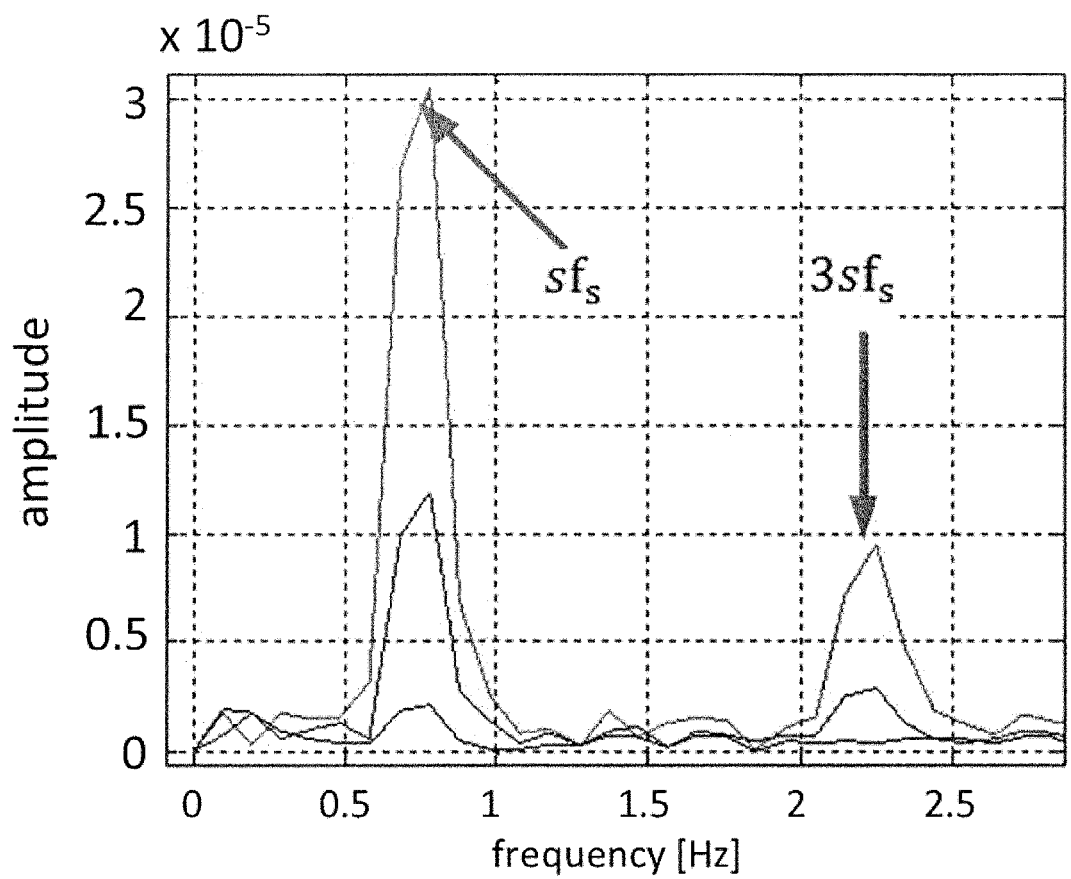
FIG. 6C illustrates zoom in to the low frequency of magnetic field spectrum for the broken rotor bar case. The characteristic frequencies (the dominant as well as the third harmonic) are clearly visible in this region.

FIGS. 6A and 6B respectively illustrate spectra of magnetic field data of the axial magnetic field spectra of a healthy electric machine and a faulty electric machine with a broken rotor bar. Both figures present spectra of magnetic field signals measured by magnetic field sensor It can be seen that the majority of the energy is concentrated in the lower parts of the spectrum in the broken rotor bar case (FIG. 6B) as opposed to more evenly distributed energy in the healthy motor case (FIG. 6A). FIG. 6C illustrates zoom in to the low frequency of magnetic field spectrum for the broken rotor bar case. The characteristic frequencies (the dominant as well as the third harmonic) are clearly visible in this region. Due to the clear presence of these components in the signal a potential indicator of a broken rotor bar could be formulated as the ratio of the amplitude of $f_{bb}$ frequency and the RMS of the whole signal.

The skilled person shall understand that the first position in the path of the free movement is same as the second position in the path of the free movement, or they can be different from each other; consequently, the acoustic measurement and the magnetic measurement can be taken sequentially (acoustic measurement precedes magnetic measurement or vice versa) or simultaneously.

At step 44, the processing unit 13 calculates condition of the electric machine as the operation status of the electric machine based on the acoustic data from the airborne acoustics sensor 11 and the magnetic field data from the magnetic field sensor 12. For example, the processing unit 13 can compare acoustic-based indicator represented by the acoustic data and magnetic field-based indicator represented by the magnetic field data, and determining, based on the results of the comparison, if the fault is present in the electric machine. In one aspect, if both of the acoustic-based indicator and the magnetic field-based indicator show there is a fault with the electric machine, this can be an indication that the associated electric machine very likely operates in a faulty condition; if one of the acoustic-based indicator and the magnetic field-based indicator shows there is a fault, this can be an indication that the associated electric machine likely operates in a faulty condition and such possibility is not as high as the first scenario; similarly, if neither of the acoustic-based indicator and the magnetic field-based indicator indicates there is a fault, this can be an indication that the associated electric machine is healthy. Therefore, a condition of the electric machine can be determined from double-check of the various measurements by various sensors, and thus rendering higher accuracy of the result of the fault detection. Where acoustic signal measurements of vibration generated by electric machine are taken simultaneously with the magnetic field measurements, it is helpful for reaching a more accurate result of fault detection.

The monitoring system 1 according to an embodiment of present invention can be implemented in a mobile device equipped with the portable unit 10, the airborne acoustics sensor 11, the magnetic field sensor 12 and the processing unit 13, such as mobile phone, Pad, PDA and the like. Thus, operation status monitoring of electric machine can be detected based on measurements performed by the mobile device. The reuse of a mobile device to provide diagnostic information constitutes a powerful, compact and accessible tool for service technicians.

Figure 7:
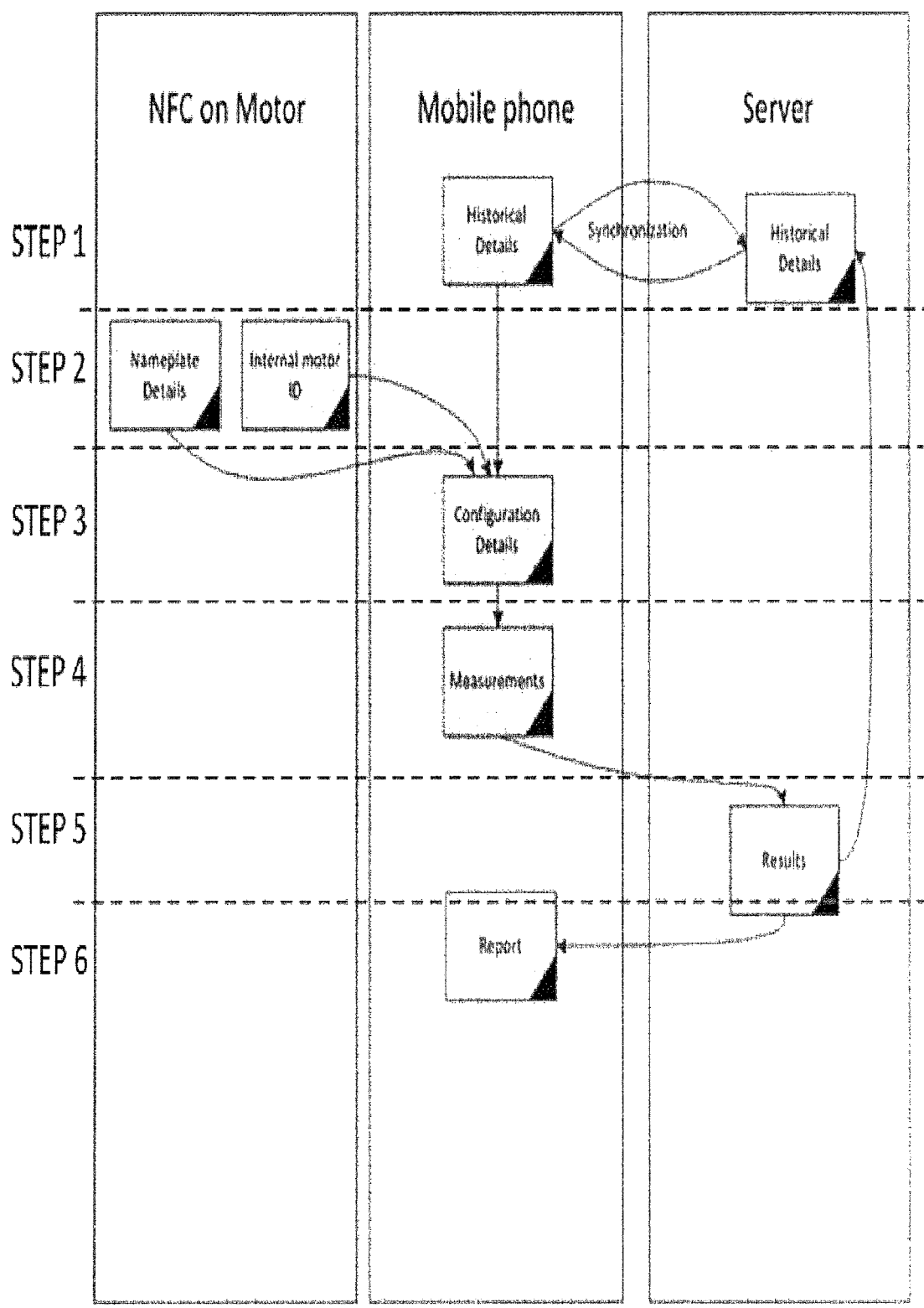
FIG. 7 shows the signal flow of a server-based system for monitoring operation status of an electric machine.

FIG. 7 shows the signal flow of a server-based system for monitoring operation status of an electric machine. The server-based system for monitoring operation status of an electric machine includes the system for monitoring operation status of an electric machine 1 (see FIG. 1) according to an embodiment of present invention as above, an identification marker reader, and a server. The identification marker reader can be integrated in the portable unit 10 of the system for monitoring operation status of an electric machine 1, being adapted for receiving or reading signal representing identification information concerning the electric machine from an identification marker tag on the electric machine. The server can synchronize the historical data associated with the identification information concerning the electric machine with the system for monitoring operation status of the electric machine 1. The processing unit 13 of the system for monitoring operation status of the electric machine 1 can select optimal type of calculation of the operation status of the electric machine based on electric machine parameters and historical data associated with the identification information concerning the electric machine. Preferably, the server-based system further includes a human machine interface integrated in the portable unit 10 of the monitoring system 1.

In this example as shown in FIG. 7, there are 3 distinct areas of operation, each responsible one of the following tasks: data storage, measurements and computation.

STEP 1. In this step, the operator needs to initiate a connection between the monitoring system 1 and external server in order to synchronize any historical data of the electrical machine with the monitoring system 1, should such historical data be available. Without server synchronization, data captured by the monitoring system 1 stays only on single operator's and cannot be used by other operators. At the same time it can be imagined that within one plant there are more operators who perform diagnostic of electric machines. Without the centralized data base it would be impractical to update the history bank after each measurement. Access to data base with historical data is strongly improving the quality of the analysis, for example enables trending of given indicators.

STEP 2. In this step the operator needs to specify the details of the machine of interest. This embodiment assumes that the Near Field Communication (NFC) technology tag located on the body of the motor can be utilized to store e.g. electric machine nameplate details and internal electric machine identification number (ID) in a way that is passive (no need for external power) and easy to access. There are many other ways of storing the time-invariant information of the electric machine, for example QR codes, bar codes or just the standard steel nameplate (which could be digitalized with the use of Optical Character Recognition software). However if operator got historical data of that particular machine, this machine can simply be selected from a history browser. Since typically there are many machines with the same nameplate details in the given location, it is also important to store a unique ID number of each electric machine.

STEP 3. Once the operator successfully synchronizes the data and obtains the details of the given machine, an dedicated algorithm installed on the monitoring system 1 can analyse the history information and select optimal measurements types, which are predefined before. This aims at tackling a new electric machine differently than a relatively old machine with known maintenance history.

STEP 4. In this step the operator performs the measurements according to the pre-defined measurements configuration. For example, a mobile phone application which comprises a set of step-by-step guidelines on how to make the measurements including the location of the mobile phone with respect to the motor, the duration of the test etc. This application is an integral part of the mobile phone based condition monitoring system. The diagnostic of electric motor can be performed based on many single measurement types or combination of them, for example, acoustic signals generated by vibrating electric machine, magnetic field measurements, direct vibration measurements or direct temperature measurements etc. In this example raw measurements are transferred to server which can be done by e.g. internet or GPRS, however sending some initially preprocessed data can also be realized in the case of a low quality of connection in the given plant.

STEP 5. After receiving the data, the diagnostic algorithms coded on the server can automatically process the data in a search of any signatures of incipient faults. After the analysis part is completed the history of the electric machine should be updated with the newest results. For example, the server can process the results of the calculation by the processing unit in search of any signatures of incipient faults, and the human machine interface is adapted for generating report based on processing result of the server.

STEP 6. In this step an automatic generated report, created based on the results from STEP 5 is send to operator's monitoring system 1. Typically such a report should contain information about the actual machine performance with suggestion of actions to perform.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A system for monitoring operation status of an electric machine, including:
    a portable unit, being structured for free movement around the electric machine;
    an airborne acoustics sensor including a microphone, the microphone being structured to measure acoustic data produced by the electric machine at a first position in a path of the free movement;
    a magnetic field sensor, being structured to measure magnetic field data produced by the electric machine at a second position in the path of the free movement; and
    a processing unit, being structured to calculate the operation status of the electric machine based on the acoustic data from the airborne sensor and the magnetic field data from the magnetic field sensor, and the processing unit being further structured to calculate slip of the electric machine as the operation status of the electric machine based on rotor speed information represented by the acoustic data from the microphone and synchronous frequency information represented by the magnetic field data from the magnetic field sensor;
    wherein:
    the airborne acoustics sensor and the magnetic field sensor are integrated with the portable unit.

2. The system for monitoring operation status of an electric machine according to claim 1, wherein:
    the processing unit is integrated in the portable unit.

3. The system for monitoring operation status of an electric machine according to claim 1, wherein:
    the processing unit is further structured to consider fundamental frequency of the acoustic data as the rotor speed information.

4. The system for monitoring operation status of an electric machine according to claim 1, wherein:
    the processing unit is further structured to take a frequency of the strongest harmonic peak within a predetermined range of nominal synchronous frequency as the synchronous frequency information.

5. The system for monitoring operation status of an electric machine according to claim 1, wherein:
    the processing unit is further structured to calculate the condition of the electric machine as the operation status of the electric machine based on the acoustic data from the airborne acoustics sensor and the magnetic field data from the magnetic field sensor.

6. The system for monitoring operation status of an electric machine according to claim 1, wherein:
    the first position in the path of the free movement is the same as the second position in the path of the free movement.

7. The system for monitoring operation status of an electric machine according to claim 1, wherein:
    the first position in the path of the free movement is different from the second position in the path of the free movement.

8. A server-based system for monitoring operation status of an electric machine, including:
- the system for monitoring operation status of an electric machine according to claim 1,
- an identification marker reader integrated in the portable unit of the system for monitoring operation status of an electric machine, being structured to receive or read signal representing identification information concerning the electric machine from an identification marker tag on the electric machine;
- a server, being structured to synchronize historical data associated with the identification information concerning the electric machine with the system for monitoring operation status of the electric machine;

wherein:
the processing unit of the system for monitoring operation status of the electric machine is further structured to calculate the operation status of the electric machine based on electric machine parameters and historical data associated with the identification information concerning the electric machine.

9. The server-based system for monitoring operation status of an electric machine according to claim 8, further comprising:
- an human machine interface integrated in the portable unit of the system for monitoring operation status of the electric machine according to claim 1;

wherein:
the server is further structured to process results of the calculation by the processing unit in search of any signatures of incipient faults; and
the human machine interface is structured to generate report based on processing result of the server.

10. A mobile phone having the system for monitoring operation status of an electric machine according to claim 1.

11. The system for monitoring operation status of an electric machine according to claim 2, wherein:
the processing unit is further structured to calculate slip of the electric machine as the operation status of the electric machine based on rotor speed information represented by the acoustic data from the airborne acoustics sensor and synchronous frequency information represented by the magnetic field data from the magnetic field sensor.

12. The system for monitoring operation status of an electric machine according to claim 3, wherein:
the processing unit is further structured to take the fundamental frequency of the acoustic data using Harmonic Product Spectrum.

13. The system for monitoring operation status of an electric machine according to claim 3, wherein:
the processing unit is further structured to take a frequency of the strongest harmonic peak within a predetermined range of nominal synchronous frequency as the synchronous frequency information.

14. The system for monitoring operation status of an electric machine according to claim 5, wherein:
the processing unit is further structured to compare an acoustic-based indicator represented by the acoustic data and magnetic field-based indicator represented by the magnetic field data, and determine, based on the results of the comparison, if the fault is present in the electric machine.

15. The system for monitoring operation status of an electric machine according to claim 11, wherein:
the processing unit is further structured to consider fundamental frequency of the acoustic data as the rotor speed information.

16. The system for monitoring operation status of an electric machine according to claim 11, wherein:
the processing unit is further structured to take a frequency of the strongest harmonic peak within a predetermined range of nominal synchronous frequency as the synchronous frequency information.

17. The system for monitoring operation status of an electric machine according to claim 12, wherein:
the processing unit is further structured to take a frequency of the strongest harmonic peak within a predetermined range of nominal synchronous frequency as the synchronous frequency information.

18. The system for monitoring operation status of an electric machine according to claim 15, wherein:
the processing unit is further structured to take the fundamental frequency of the acoustic data using Harmonic Product Spectrum.

19. The system for monitoring operation status of an electric machine according to claim 15, wherein:
the processing unit is further structured to take a frequency of the strongest harmonic peak within a predetermined range of nominal synchronous frequency as the synchronous frequency information.

* * * * *